(12) United States Patent
Hsueh

(10) Patent No.: US 8,922,280 B2
(45) Date of Patent: Dec. 30, 2014

(54) TEMPERATURE COMPENSATION CIRCUIT AND ELECTRONIC DEVICE WITH TEMPERATURE COMPENSATION

(71) Applicant: Wistron Corporation, New Taipei (TW)

(72) Inventor: Po Wen Hsueh, New Taipei (TW)

(73) Assignee: Wistron Corporation, New Taipei (TW)

( * ) Notice: Subject to any disclaimer, the term of this patent is extended or adjusted under 35 U.S.C. 154(b) by 11 days.

(21) Appl. No.: 13/889,735

(22) Filed: May 8, 2013

(65) Prior Publication Data

US 2014/0062600 A1 Mar. 6, 2014

(30) Foreign Application Priority Data

Sep. 4, 2012 (TW) .............................. 101132147 A

(51) Int. Cl.
*H03F 3/04* (2006.01)
*H03G 3/00* (2006.01)
*H03F 1/30* (2006.01)

(52) U.S. Cl.
CPC .. *H03F 1/30* (2013.01); *H03G 3/00* (2013.01); *H03F 2200/447* (2013.01); *H03F 2200/444* (2013.01); *H03F 2200/211* (2013.01)
USPC ........................................ 330/289; 330/207 P

(58) Field of Classification Search
USPC ................................ 330/289, 207 P, 278, 279
See application file for complete search history.

(56) References Cited

U.S. PATENT DOCUMENTS

| 4,000,650 A | * | 1/1977 | Snyder ........................ 73/290 V |
| 4,207,538 A | | 6/1980 | Goel |
| 4,882,767 A | * | 11/1989 | Machida et al. .............. 455/117 |
| 5,162,750 A | * | 11/1992 | Ito et al. ........................ 330/256 |
| 6,426,495 B1 | * | 7/2002 | Hayami et al. ............. 250/214 R |
| 6,603,110 B2 | * | 8/2003 | Hayami et al. ............. 250/214 R |
| 8,779,274 B2 | * | 7/2014 | Arnold ............................. 84/735 |
| 2006/0035596 A1 | | 2/2006 | Young et al. |

OTHER PUBLICATIONS

Office Action issued to Taiwanese Counterpart Application No. 101132147 by the Taiwan Intellectual Property Office on Oct. 9, 2014, along with an English translation of the sections boxed in red.
English translation of sections boxed in red on Taiwanese Office Action dated Oct. 9, 2014 for Counterpart Taiwanese Application No. 101132147.

* cited by examiner

*Primary Examiner* — Henry Choe
(74) *Attorney, Agent, or Firm* — John A. Fortkort; Fortkort & Houston P.C.

(57) ABSTRACT

A temperature compensation circuit is adapted to be used in an electronic device including a processing circuit. The temperature compensation circuit includes a thermistor, a compensation capacitor and a compensation diode. The thermistor has two ends, one of which is adapted to be electrically connected to the processing circuit. The compensation capacitor has two ends, one of which is electrically connected to the other one of the two ends of the thermistor. The compensation diode has an anode electrically connected to the other one of the two ends of the compensation capacitor, and a cathode to be grounded. The impedance of the thermistor varies with temperature so as to compensate and stabilize an output of the electronic device.

5 Claims, 2 Drawing Sheets

TEMPERATURE COMPENSATION CIRCUIT AND ELECTRONIC DEVICE WITH TEMPERATURE COMPENSATION

CROSS-REFERENCE TO RELATED APPLICATION

This application claims priority of Taiwanese Application No. 101132147, filed on Sep. 4, 2012, the disclosure of which is incorporated herein by reference

BACKGROUND OF THE INVENTION

1. Field of the Invention

The present invention relates to an electronic device, more particularly to an electronic device with temperature compensation.

2. Description of the Related Art

Referring to FIG. 1, a conventional radio frequency (RF) output circuit 900 receives and attenuates an RF signal through an attenuator 910, and then amplifies the RF signal through a power amplifier 920. During operation of the conventional RF output circuit 900, when the gain of the power amplifier 920 varies with temperature, a power detector 930 will detect a power variation of a load 950 coupled to an output terminal of the power amplifier 920, and outputs a detecting result to a comparator 940. Then, the comparator 940 compares the detecting result with a reference voltage (Vref), and afterward, outputs a comparing result to the attenuator 910 for feedback control of an amount of signal attenuation by the attenuator 910 so as to stabilize the output of the power amplifier 920 as well as achieve auto level control (ALC) and temperature compensation.

Nevertheless, the closed loop circuit design of the conventional BF output circuit 900 is relatively expensive and complicated, and thus, is unsuited for application to low-price products and apparatuses.

SUMMARY OF THE INVENTION

Therefore, an object of the present invention is to provide a temperature compensation circuit implemented with an open loop circuit that is relatively low cost and low in complexity.

Accordingly, a temperature compensation circuit of this invention is adapted to be used in an electronic device and to be electrically connected to a processing circuit of the electronic device. The temperature compensation circuit comprises a thermistor, a compensation capacitor and a compensation diode. The thermistor has two ends, one of which is to be electrically connected to the processing circuit. The compensation capacitor has two ends, one of which is electrically connected to the other one of the two ends of the thermistor. The compensation diode has an anode electrically connected to the other one of the two ends of the compensation capacitor and a cathode to be grounded. The impedance of the thermistor varies with temperature so as to compensate and stabilize an output of the processing circuit.

A rate of change of the Impedance of the thermistor with respect to temperature is inversely proportional to a rate of change of gain of the processing circuit with respect to temperature.

Another object of the present invention is to provide an electronic device capable temperature compensation to stabilize an output thereof using an open loop circuit.

According to another aspect, an electronic device of this invention comprises a processing circuit and a temperature compensation circuit. The processing circuit has a gain that varies with temperature. The temperature compensation circuit includes a thermistor that is electrically connected to the processing circuit and that has an impedance varying with temperature. A rate of change of the impedance of the thermistor with respect to temperature is inversely proportional to a rate of change of the gain of the processing unit with respect to temperature so as to compensate and stabilize an output of the processing circuit.

The temperature compensation circuit further includes a compensation diode having an anode and a cathode that is to be grounded, and a compensation capacitor electrically connected between the thermistor and the anode of the compensation diode.

BRIEF DESCRIPTION OF THE DRAWINGS

Other features and advantages of the present invention will become apparent in the following detailed description of the embodiments with reference to the accompanying drawings, of which.

DETAILED DESCRIPTION OF THE EMBODIMENTS

Figure 1:
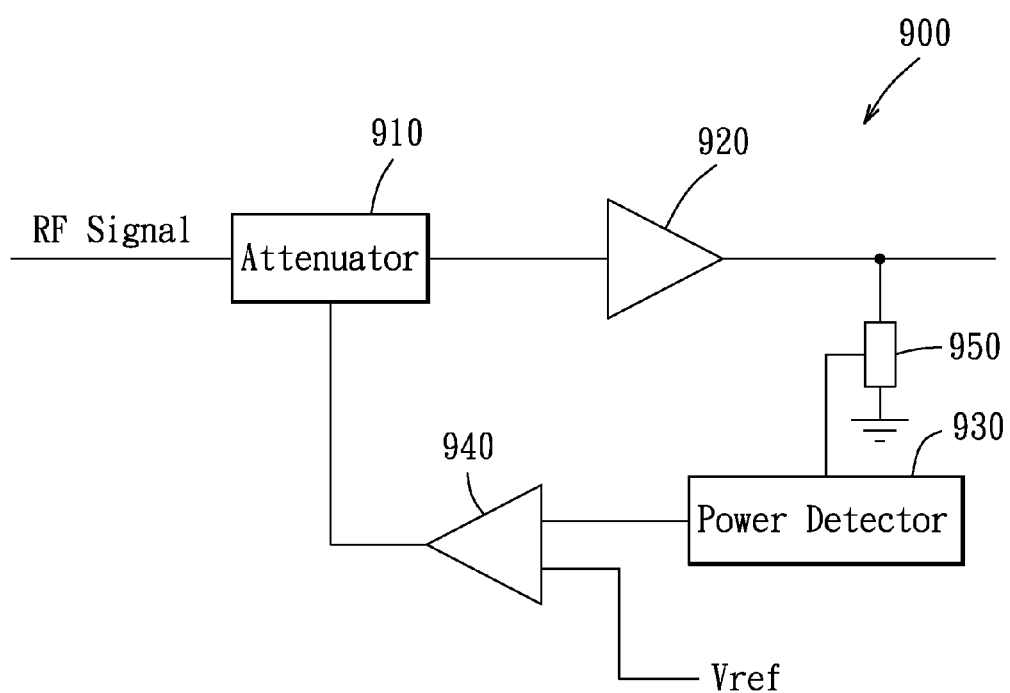
FIG. 1 is a schematic circuit diagram of a conventional radio frequency output circuit with temperature compensation.

Before the present invention is described in greater detail, it should be noted that like elements are denoted by the same reference numerals throughout the disclosure.

Figure 2:
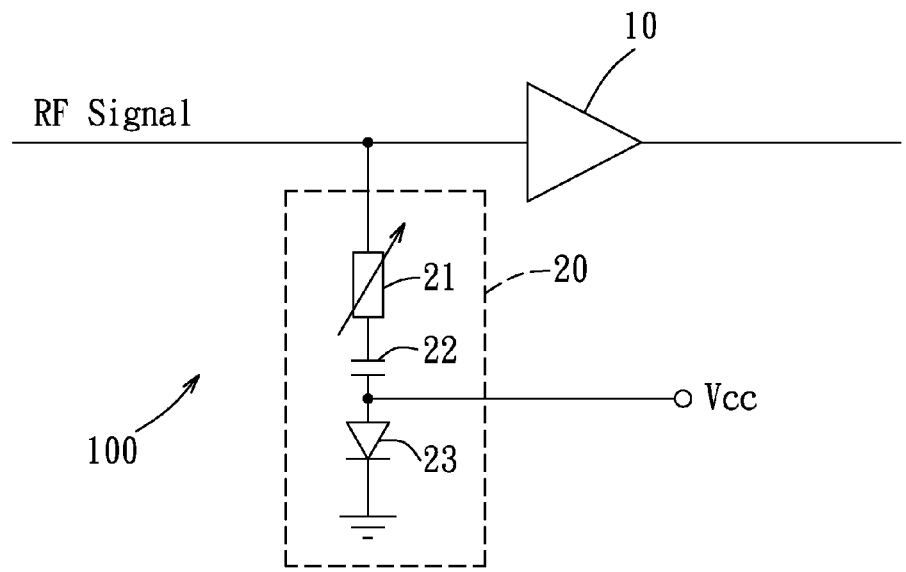
FIG. 2 is a schematic circuit diagram of the first embodiment of an electronic device with temperature compensation according to this invention.

Referring to FIG. 2, the first embodiment of an electronic device 100 with temperature compensation of this invention is a radio frequency (RF) output circuit, and includes a processing circuit 10 and a temperature compensation circuit 20. The electronic device 100 uses the temperature compensation circuit 20 to compensate variation of gain of the processing circuit 10 attributed to variation of temperature, thereby stabilizing an output of the electronic device 100.

The processing circuit 10 in the first embodiment is a power amplifier for receiving and amplifying an RF signal and outputting the amplified RF signal. The gain of the processing circuit 10 varies with temperature in a first curve.

The temperature compensation circuit 20 includes a thermistor 21, a compensation capacitor 22 and a compensation diode 23. The thermistor 21 has two ends, one of which is electrically connected to an input terminal of the processing circuit 10. Impedance of the thermistor 21 varies with temperature in a second curve that has a slope inversely proportional to a slope of the first curve. Namely, a rate of change of the impedance of the thermistor 21 with respect to temperature is inversely proportional to a rate of change of the gain of the processing circuit 10 with respect to temperature. The compensation capacitor 22 has two ends, one of which is electrically connected to the other one of the two ends of the thermistor 21. The compensation diode 23 has an anode electrically connected to the other one of the two ends of the compensation capacitor 22, and a cathode to be grounded. The anode of the compensation diode 23 receives a variable voltage (Vcc) for adjusting a voltage provided to the input terminal of the processing circuit 10 as required by different applications.

The temperature compensation circuit 20 and the processing circuit 10 are electrically connected in parallel, resulting in an amount of signal attenuation to the RF signal (e.g. 5 dB) before the SF signal enters the processing circuit 10. When the processing circuit 10 operates and the temperature increases, the gain of the processing circuit 10 will decrease and the impedance of the thermistor 21 will increase. Thus, the RF signal is attenuated by a relatively small amount before entering the processing circuit 10. As a result, a relatively greater portion of the RF signal is received by the processing circuit 10 so as to compensate the decrease in the gain of the processing circuit 10 attributed to temperature variation and to stabilize the output of the electronic device 100.

Specifically, the thermistor 21 may include one or more negative temperature coefficient (NTC) thermistors and/or one or more positive temperature coefficient (FTC) thermistors. For example, according to the variation of the gain of the processing circuit 10 with respect to temperature, the thermistor 21 may consist of a single NTC thermistor or a plurality of NTC thermistors in series/parallel connection, or a single PTC thermistor or a plurality of PTC thermistors in series/parallel connection, or a combination of the NTC thermistors and the PTC thermistors. This invention is not limited to any particular arrangement or embodiment of the thermistor 21, as long as the rate of change of the impedance of the thermistor 21 is inversely proportional to the rate of change of the gain of the processing circuit 10 with respect to temperature.

Figure 3:
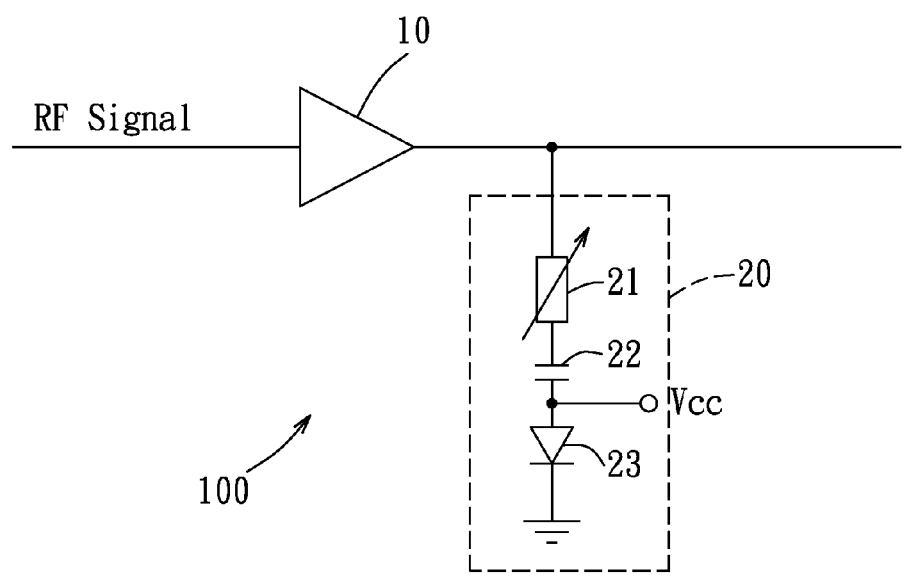
FIG. 3 is a schematic circuit diagram of the second embodiment of an electronic device with temperature compensation according to this invention.

Referring to FIG. 3, the second embodiment of the electronic device 100 with temperature compensation of this invention is similar to the first embodiment. The difference resides in that one of the two ends of the thermistor 21 of the temperature compensation circuit 20 is electrically connected to an output terminal of the processing circuit 10.

Similarly, as temperature increases, the gain of the processing circuit 10 decreases and the impedance of the thermistor 21 of the temperature compensation circuit 20 increases. Thus, the RF signal outputted by the processing circuit 10 at the output terminal is attenuated by the thermistor 21 due to the increase of the impedance of the thermistor 21. Accordingly, the temperature compensation circuit 20 of this embodiment can also achieve temperature compensation for the output of the electronic device 100.

To sum up, the electronic device 100 with temperature compensation of this invention uses the temperature compensation circuit 20 to compensate the variation of the gain of the processing circuit 10 so as to stabilize the output of the electronic device 100. Moreover, the open loop circuit of the electronic device 100 can not only stabilize the output of the electronic device 100 but also has a relatively low cost and low complexity.

While the present invention has been described in connection with what are considered the most practical embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A temperature compensation circuit adapted to be used in an electronic device and to be electrically connected to a processing circuit of the electronic device, said temperature compensation circuit comprising:
   a thermistor having two ends, one of which is adapted to be electrically connected to the processing circuit;
   a compensation capacitor having two ends, one of which is electrically connected to the other one of said two ends of said thermistor; and
   a compensation diode having an anode electrically connected to the other one of said two ends of said compensation capacitor, and a cathode to be grounded;
   wherein impedance of said thermistor varies with temperature so as to compensate and stabilize an output of the electronic device.

2. The temperature compensation circuit as claimed in claim 1, wherein a rate of change of the impedance of said thermistor with respect to temperature is inversely proportional to a rate of change of gain of the processing circuit with respect to temperature.

3. The temperature compensation circuit as claimed in claim 1, wherein said one of said two ends of said thermistor is to be electrically connected to an input terminal of the processing circuit.

4. The temperature compensation circuit as claimed in claim 1, wherein said one of said two ends of said thermistor is to be electrically connected to an output terminal of the processing circuit.

5. The temperature compensation circuit as claimed in claim 1, wherein said processing circuit is a power amplifier.

* * * * *